United States Patent
Takada (10) Patent No.: US 7,202,753 B2
(45) Date of Patent: Apr. 10, 2007

(54) OSCILLATION CIRCUIT AND RADIO COMMUNICATION DEVICE USING THE SAME

(75) Inventor: Yutaka Takada, Nagano-ken (JP)

(73) Assignee: Seiko Epson Corporation (JP)

( * ) Notice: Subject to any disclaimer, the term of this patent is extended or adjusted under 35 U.S.C. 154(b) by 8 days.

(21) Appl. No.: 10/902,686

(22) Filed: Jul. 29, 2004

(65) Prior Publication Data

US 2005/0057318 A1    Mar. 17, 2005

(30) Foreign Application Priority Data

Aug. 1, 2003   (JP)  .............................. 2003-285019

(51) Int. Cl.
   *H03B 5/32*   (2006.01)
(52) U.S. Cl. ............... 331/107 A; 331/34; 331/74; 331/107 DP; 331/135
(58) Field of Classification Search ........... 331/107 A, 331/74, 107 DP, 34, 135
   See application file for complete search history.

(56) References Cited

U.S. PATENT DOCUMENTS

| | | | | |
|---|---|---|---|---|
| 5,446,330 A | * | 8/1995 | Eda et al. ............... | 310/313 R |
| 5,608,360 A | * | 3/1997 | Driscoll ................. | 331/107 A |
| 6,222,299 B1 | | 4/2001 | Graebner et al. ....... | 310/313 R |
| 6,727,767 B2 | * | 4/2004 | Takada .................. | 331/107 A |
| 6,980,061 B2 | * | 12/2005 | Takada et al. .......... | 331/107 A |

FOREIGN PATENT DOCUMENTS

| | | |
|---|---|---|
| EP | 1 298 790 A1 | 2/2003 |
| JP | 05-121949 | 5/1993 |
| JP | 10-075141 | 3/1998 |
| JP | 10-173442 | 6/1998 |
| JP | 2003-110360 | 4/2003 |
| JP | 2003-124744 | 4/2003 |

OTHER PUBLICATIONS

Avramov I D et al, "High-performance surface transverse wave based voltage controlled feedback oscillators in the 2.0 to 2.5 GHz range", Frequency Control Symposium, 1998, pp. 519-527.
Communication from European Patent Office re: counterpart application, Jan. 2005.

* cited by examiner

*Primary Examiner*—Arnold Kinkead
(74) *Attorney, Agent, or Firm*—Harness, Dickey & Pierce, P.L.C.

(57) ABSTRACT

An power divider and a surface acoustic wave resonator are provided to a feedback path of an amplifier for oscillation. The surface acoustic wave resonator connects an input side of the amplifier and the power divider connects an output side of the amplifier so as to suppress an input power input to the surface acoustic wave resonator and to secure an output power output from an output terminal of the power divider.

6 Claims, 5 Drawing Sheets

OSCILLATION CIRCUIT AND RADIO COMMUNICATION DEVICE USING THE SAME

RELATED APPLICATIONS

This application claims priority to Japanese Patent Application No. 2003-285019 filed Aug. 1, 2003 which is hereby expressly incorporated by reference herein in its entirety.

BACKGROUND

The present invention relates to an oscillation circuit having a surface acoustic wave resonator disposed at least in a feedback path of an amplifier, and a radio communication device using the same.

Recently, an oscillation circuit using a surface acoustic wave resonator is used for configuring the oscillation circuit to have a frequency in, for example, the GHz range. However, a surface acoustic wave resonator has a power handling capability that is lower than that of a dielectric filter. This causes a problem in that a large power application accelerates the deterioration of a inter digital transducer which results in a fluctuation of oscillation frequency, a reduction of oscillation power output and finally no oscillation.

In order to solve this problem, a method for manufacturing a surface acoustic wave resonator with improved power handling capability has been proposed (for example, in Japanese Unexamined Patent Publication No.10-75141). That is, an electrode composed of aluminum or an aluminum alloy is formed on a piezoelectric substrate. A layer composed of another element having a diffusion coefficient that is equal to or greater than that of the aluminum is formed on at least a part of the electrode. Subjecting the layer composed of the another element to a heat treatment at a temperature higher than that at which the another element can diffuse leads the another element to diffuse in a thickness direction of the electrode so as to form the electrode composed of the aluminum alloy including the another element.

In addition, a frequency converter equipped with a local oscillation part with an amplifier provided to a succeeding stage of an oscillation circuit so as to ensure the desired output power has been proposed (for example, in Japanese Unexamined Patent Publication No.5-121949).

In addition, a quartz crystal oscillator where an oscillation inverter composed of a MOS-FET for oscillation is connected in parallel with a quartz crystal resonator has been proposed. This sets an on-resistance of the MOS-FET configuring the oscillation inverter so as to control a power applied to the quartz crystal oscillator (for example, in Japanese Unexamined Patent Publication No.10-173442).

In the conventional example described in the above-mentioned Japanese Unexamined Patent Publication No.10-75141, while the power handling capability of the surface acoustic wave resonator itself can be improved, there is the unsolved problem that a continuous oscillating condition in which a large power is applied shortens an elapsed time in which the continuous oscillating can be maintained. As a result, the continuous oscillating condition cannot be stably maintained for a long time.

Also, in the conventional example described in the above-mentioned Japanese Unexamined Patent Publication No.5-121949, while the output power can be increased since the oscillation output from the oscillator in the local oscillation part is amplified by an amplifier after multiplying by a quadrupling circuit to be output, there is the unsolved problem that no countermeasures enable the surface acoustic wave resonator configuring the oscillation circuit to improve the power handling capability and to extend life.

In addition, in the conventional example described in the above-mentioned Japanese Unexamined Patent Publication No.10-173442, including a resistor so as to suppress the power of the amplifier controls the power applied to the quartz crystal oscillator, however, there is the unsolved problem that it cannot be applied to the oscillation circuit using the surface acoustic wave resonator.

The present invention focuses on the unsolved problems of the above-mentioned conventional examples and aims to provide an oscillation circuit and radio communication device using the same that are capable of maintaining a continuous oscillation condition for a long time while suppressing the power applied to the surface acoustic wave resonator.

SUMMARY

A first aspect of the invention is characterized in that in an oscillation circuit that includes at least an amplifier, a surface acoustic wave resonator provided to a feedback path of the amplifier, and an power divider outputting an oscillation signal in the feedback path to the outside, the surface acoustic wave resonator is coupled to an input side of the amplifier so as to supply an input power to saturate the amplifier, and the power divider is coupled to an output side of the amplifier.

In the first aspect of the invention, since the surface acoustic wave resonator is connected to the input side of the amplifier so as to supply the input power enabling the amplifier to keep a stable oscillation condition in a saturated condition, the surface acoustic wave resonator is provided at an ending stage of the feedback path of the amplifier. This makes it possible to minimize the applied power that is input to the surface acoustic wave resonator so as to keep the surface acoustic wave resonator in a continuous oscillation condition for a long time. In addition, since the power divider is connected to the output side of the amplifier, the output power of the amplifier can be output directly to the outside so as to achieve a large output power, thereby requiring no amplifier at the succeeding stage of the oscillation circuit for increasing the output power.

A second aspect of the invention is characterized in that an oscillation circuit includes at least an amplifier, a surface acoustic wave resonator provided to a feedback path of the amplifier, a phase shifter changing a phase in the feedback path by inputting a control voltage from outside, and an power divider outputting an oscillation signal in the feedback path to the outside, the surface acoustic wave resonator is coupled to an input side of the amplifier so as to supply an input power to saturate the amplifier, and the power divider is coupled to an output side of the amplifier.

The second aspect of the invention can configure a voltage controlled oscillation circuit that is capable of keeping the continuous oscillation condition for a long time with minimum power applied to the surface acoustic wave resonator and of achieving large output power.

In addition, a third aspect of the invention is characterized in that the surface acoustic wave resonator of the above-mentioned first and second aspects of the invention is further configured such that a inter digital transducer is formed on a diamond substrate.

In the third aspect of the invention, configuring the surface acoustic wave resonator such that the inter digital transducer is formed on the diamond substrate allows a larger propagation velocity in the diamond substrate. This makes it possible to oscillate a higher frequency and to enlarge the electrode width of the surface acoustic wave resonator as compared with another substrate material so as to improve power handling capability. In addition, few frequency fluctuations due to a temperature change enable a high accuracy oscillation circuit to be achieved.

Further, a fourth aspect of the invention is characterized in that a radio communication device includes the oscillation circuit according to any of the first through third aspects of the invention.

In the fourth aspect of the invention, configuring the radio communication device by the oscillation circuit that is capable of keeping the continuous oscillation for a long time allows the radio communication device to have a long life.

BRIEF DESCRIPTION OF THE DRAWINGS

FIGS. 3(a) and (b) are sectional views illustrating a surface acoustic wave resonator of the first embodiment.

DETAILED DESCRIPTION

Embodiments of the invention will now be described with reference to the accompanying drawings below.

Figure 1:
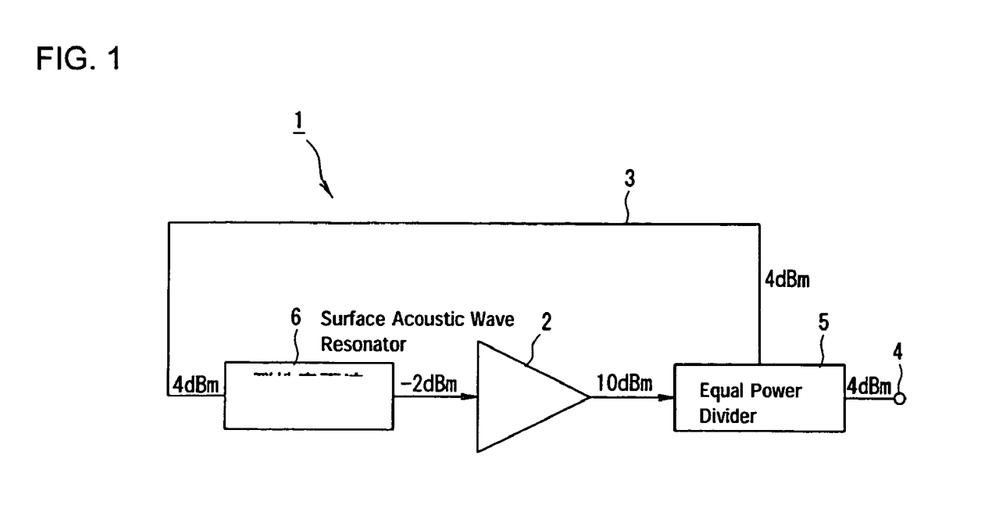
FIG. 1 is a block diagram illustrating a first embodiment of the invention.

FIG. 1 is a block diagram illustrating a first embodiment of the invention. In FIG. 1, an oscillation circuit 1 includes an amplifier 2 for oscillation.

In a feedback path 3 extending from an output side of the amplifier 2 to its input side, an power divider 5 and a surface acoustic wave resonator 6 are provided. The power divider 5 connected to the output side of the amplifier 2 equally distributes the power in an oscillating loop to output one of the distributed outputs to an output terminal 4 outside of the oscillating loop. The surface acoustic wave resonator 6 is connected to an input side of the amplifier 2 and receives the other of the equally distributed outputs of the power divider 5. Each of these blocks is connected to each other so as to be matched to a constant characteristic impedance, for example, 50 Ω.

Figure 2:
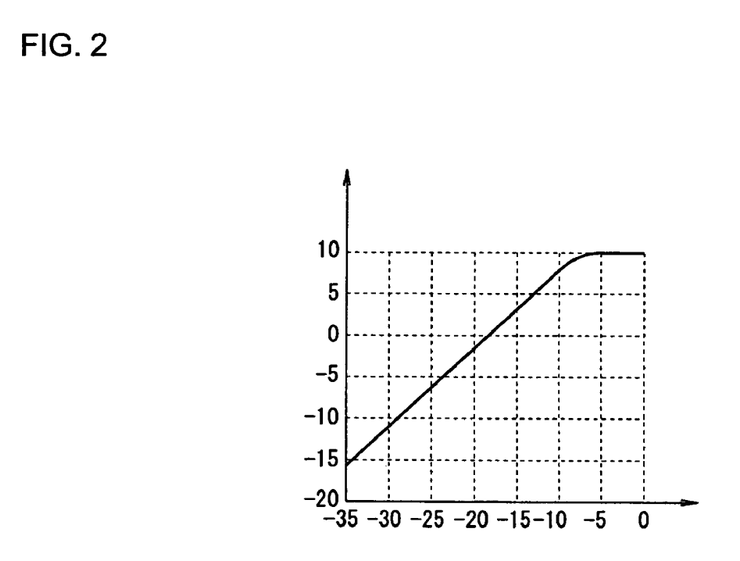
FIG. 2 is a diagram illustrating an input/output characteristic of an amplifier of the first embodiment.

The amplifier 2 has an input/output characteristic shown in FIG. 2. When the horizontal axis and vertical axis represent an input power Pin (dBm) and an output power Pout (dBm) respectively, the input/output characteristic is set as follows. The output power Pout increases linearly from minus 16 dBm to 8 dBm while the input power Pin increases from minus 35 dBm to minus 10 dBm. Then, the output power Pout increases slowly while the input power Pin increases to minus 5 dBm. Further, the output power Pout reaches approximately 10 dBm which is the saturated region for a steady oscillation condition, when the input power Pin reaches minus 5 dBm and above.

The power divider 5 equally allocates the amplified output and outputs to the surface acoustic wave resonator 6 and the output terminal 4 respectively through the feedback path 3.

Figure 3:
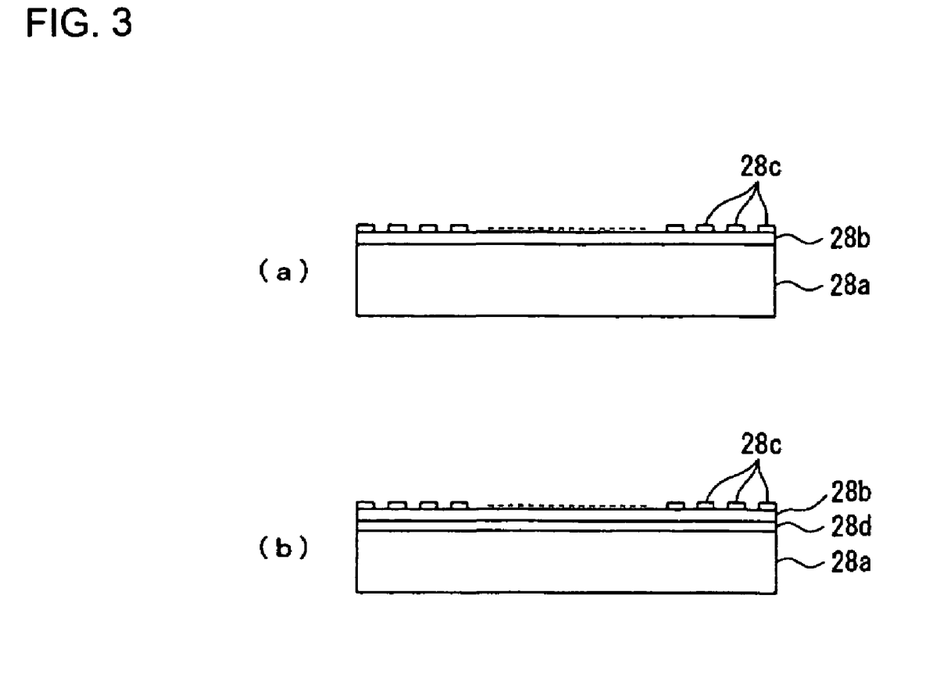

In addition, as shown in FIG. 3(a), the surface acoustic wave resonator 6 is configured such that a thin film piezoelectric layer 28b such as zinc oxide (ZnO), aluminum nitride (AlN), lead dioxide (PbO2), zirconium dioxide (ZrO2), titanium dioxide (TiO2) or the like is formed on a diamond layer or a diamond-like carbon film layer 28a by a sputtering method or a vapor-phase synthesis method or the like, and a inter digital transducer 28c is formed on the thin film piezoelectric layer 28b. Other than this, as shown in FIG. 3(b), a semiconductive diamond layer 28d may be formed between the diamond or diamond-like carbon film layer 28a and the thin film piezoelectric layer 28b. The semiconductive diamond layer 28d is formed by introducing an impurity such as boron (B), aluminum (Al), phosphorous (P), sulfur (S) or the like, and/or by introducing a grid defect using ion injection or electron irradiation to an insulative diamond single crystal. Additionally, the semiconductive diamond layer may form the inter digital transducer 28c. In this way, forming the inter digital transducer on the diamond layer or the diamond-like carbon film layer enables a propagation velocity in a substrate to be large. This makes it possible to oscillate at a higher frequency and to enlarge the electrode width of the surface acoustic wave resonator as compared with another substrate material so as to improve power handling capability. Few frequency fluctuations due to a temperature change enable a higher accuracy oscillation circuit to be achieved.

The oscillation circuit 1 having the above-mentioned configuration includes a construction of the feedback type oscillator where a feedback circuit is connected to the amplifier 2 for oscillation.

If an input voltage Vi appears at the input side of the amplifier 2 having an amplification factor G, an output voltage Vo that the input voltage Vi is amplified G times (=Vi·G) appears at the output side. The output voltage Vo is returned to the input side as a feedback voltage Vf through the feedback circuit having a feedback ratio β. Here, Vf=Vo·β=Vi·G·β.

In this case, if a phase of the feedback voltage Vf is equal to that of the input voltage Vi, the feedback voltage Vf is larger than the input voltage Vi. This results in a positive feedback to generate the oscillation.

Here, a phase of the input voltage Vi is $\theta_i$, a phase of the feedback voltage Vf is $\theta_f$, a phase change of the amplifier 2 is $\theta_G$, and a phase change of the feedback circuit $\Theta\beta$. In order to generate the oscillation, it is required to satisfy the relationship expressed by the following equation (1).

$$Vi \cdot G \cdot \beta \cdot e^{j(\theta_i + \theta_G + \theta\beta)} \geq Vi \cdot e^{j(2n\pi + \theta_i)} \quad (1)$$

In the equation (1), the phase of the input voltage Vi is required to be the same when the input voltage Vi is input and when it is fed back to the input side after passing through the amplifier 2 and the feedback circuit. That is, the following equations are satisfied.

$$\theta_G + \theta\beta = 2n\pi (n=0, 1, 2, \ldots) \quad (2)$$

$$G \cdot \beta > 1 \quad (3)$$

The equation (2) shows a phase condition of the oscillation circuit. The equation (3) shows an amplitude condition of the oscillation circuit.

Actually, if the feedback voltage Vf increases, the output voltage Vo of the amplifier 2 saturates to the steady condition where G·β=1

Since the power divider 5 can allocate the output power of the amplifier 2 and output to the outside of the oscillating loop without disturbing the impedance in the oscillating loop, this enables a circuit to operate more stably to a load.

Next, an operation of the first embodiment will be described.

As above-mentioned, the input/output characteristic of the amplifier 2 for oscillation is set such that if the input power Pin reaches minus 5 dBm and above, it becomes saturated where the output power Pout is kept at approximately 10 dBm so as to be in a steady oscillation condition, as shown in FIG. 2.

In the steady oscillation condition, the output power Pout of 10 dBm that is output from the amplifier 2 is equally allocated to the output terminal 4 and the feedback circuit 3 by the power divider 5 so as to be output at 4 dBm respectively. Accordingly, the input power of 4 dBm is input to the input side of the surface acoustic wave resonator 6. Subtracting an insertion loss of 6 dBm results in the input power Pin of the amplifier 2 of minus 2 dBm.

In this way, the configuration where the surface acoustic wave resonator 6 is connected to the input side of the amplifier 2 being in the feedback path 3 results in the input power of 4 dBm applied to the surface acoustic wave resonator 6. This is much smaller than the input power of 10 dBm where the surface acoustic wave resonator is provided to the output side of the amplifier 2 for oscillation. This is approximately 1/16 in terms of milliwatts.

This can minimize the power applied to a fine inter digital element having a size on the sub-micron order in the surface acoustic wave resonator 6 so as to prevent the electrode from deterioration, thereby maintaining a stable characteristic of the resonator for a long time. Consequently, the oscillation characteristic having low frequency aging and high reliability can be achieved even if it is assembled to the oscillation circuit.

In addition, the power divider 5 connected to the output side of the amplifier 2 can output a gain of the amplifier 2 to the outside without waste. This increases the output power of the oscillation circuit so as to improve a signal/noise ratio (S/N), thereby enabling an oscillation characteristic having an excellent phase noise characteristic to be achieved.

Additionally, a high output power can be achieved by one oscillation circuit 1. This requires no buffer amplifier provided to a succeeding stage of the oscillation circuit in order to amplify the output power as in a conventional example, thereby enabling size, power consumption, and cost to be reduced as a whole.

Further, the surface acoustic wave resonator 6 includes a diamond substrate configured such that the thin film piezoelectric layer 28b is formed on the diamond layer or the diamond-like carbon film layer 28a and the inter digital transducer 28c is formed on the thin film piezoelectric layer 28b. This allows larger propagation velocity in the substrate as compared with a surface acoustic wave resonator employing a substrate made of a quartz crystal or a lithium tantalite, which makes it possible to oscillate at a higher frequency (GHz range) and to enlarge the electrode width of the inter digital transducer so as to improve power handling capability. In addition, few frequency fluctuations due to temperature change enable the higher accuracy oscillation circuit to be achieved.

In the above-mentioned first embodiment, while the case where the amplified output of the amplifier 2 for oscillation is equally distributed in the oscillating loop and to the outside of the oscillating loop by power divider 5 has been described, the embodiment is not limited to this. The amplified output of the amplifier 2 for oscillation may be distributed at an arbitrary distribution ratio in the oscillating loop and to the outside of the oscillating loop by applying an unequal power divider.

Next, a second embodiment of the invention will be described with reference to FIG. 4 and FIG. 5.

In the second embodiment, the invention is applied to a voltage controlled oscillation circuit.

Figure 4:
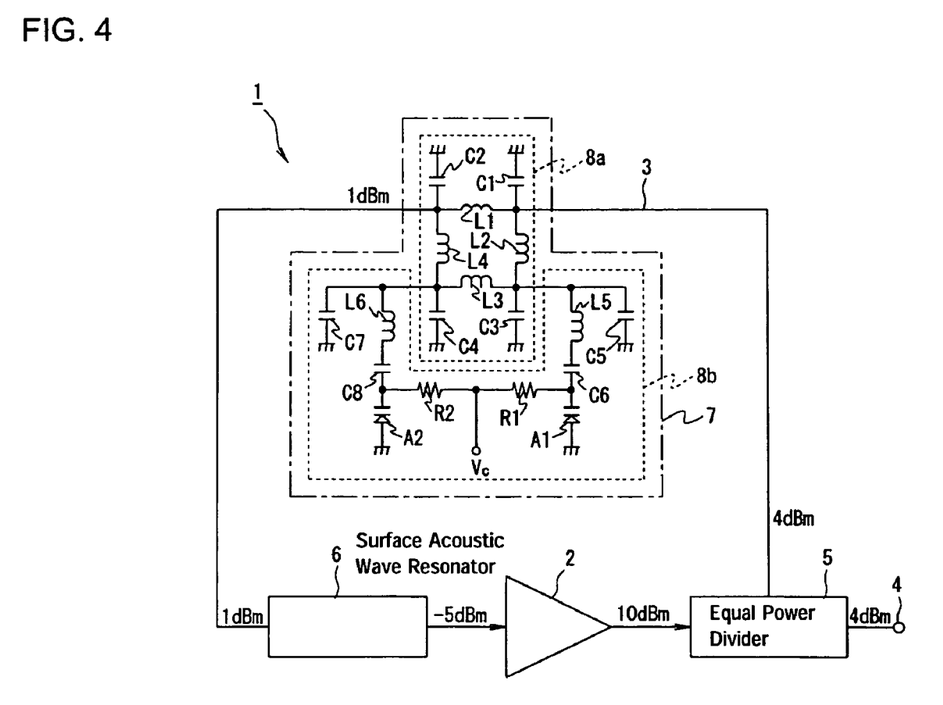
FIG. 4 is a block diagram illustrating a second embodiment of the invention.
Figure 5:
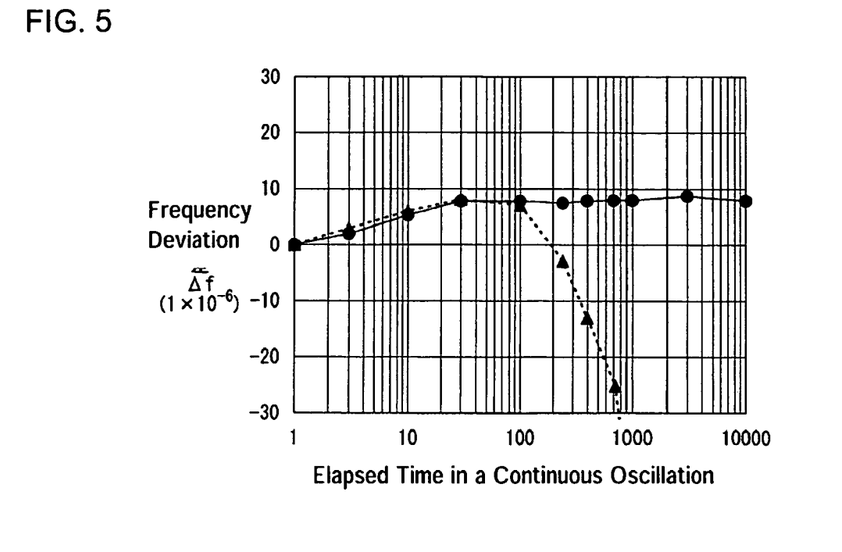
FIG. 5 is a characteristic diagram illustrating a relationship between an elapsed time in a continuous oscillation and a frequency deviation.

In other words, as shown in FIG. 4, the second embodiment includes the same configuration as that of FIG. 1 of the first embodiment except that a phase shifter 7 varying a phase in the oscillating loop by inputting a control signal from the outside is provided between the output terminal of the power divider 5 in the oscillating loop and the surface acoustic wave resonator 6. Parts corresponding to that of FIG. 1 are given the same label and a duplicate detailed description will be omitted.

The phase shifter 7 includes a minus 3 dB 90 degree hybrid coupler 8a and an additional control part 8b.

The minus 3 dB 90 degree hybrid coupler 8a includes capacitors C1 to C4 and coils L1 to L4. The coils L1 to L4 are connected in a loop. The capacitor C1 and the output side of the power divider 5 are connected between the coils L1 and L2. The capacitor C3 is connected between the coils L2 and L3. The capacitor C4 is connected between the coils L3 and L4. The capacitor C2 and the input side of the surface acoustic wave resonator 6 are connected between the coils L4 and L1.

In addition, the additional control part 8 configured by a variable reactance circuit includes capacitors C5 to C8, coils L5 and L6, resistors R1 and R2, and variable capacitors A1 and A2. The capacitor C5, the coil L5, the capacitor C6, the resistor R1, the resistor R2, the capacitor C8, the coil L6, and the capacitor C7 are connected in series in this order. The terminal between the capacitor C5 and the coil L5 is connected to the terminal between the capacitor C3 and the coil L2 of the minus 3 dB 90 degree hybrid coupler 8a. The terminal between the capacitor C7 and the coil L6 is connected to the terminal between the capacitor C4 and the coil L4 of the minus 3 dB 90 degree hybrid coupler 8a.

In addition, the variable capacitor A1 is connected between the capacitor C6 and the resistor R1. The variable capacitor A2 is connected between the capacitor C8 and the resistor R2. An input terminal of a control voltage Vc is provided between the resistor R1 and the resistor R2.

Next, an operation of the second embodiment will be described.

If the amplifier 2 for oscillation is saturated and the amplified output power is 10 dBm which is the same as the first embodiment, the amplified output power is allocated at 4 dBm respectively by the power divider 5 and one of the divided outputs is output from the output terminal 4 and the other of the divided outputs is supplied to the phase shifter 7.

Since the phase shifter 7 includes the minus 3 dB 90 degree hybrid coupler 8a, the output power that has a phase difference of 90 degrees and of 1 dBm, which is attenuated by 3 dBm from the divided output power of 4 dBm due to the insertion loss of the hybrid coupler, is output to the surface acoustic wave resonator 6.

Accordingly, the input power of 1 dBm to the surface acoustic wave resonator 6 becomes the output power of minus 5 dBm after subtracting the insertion loss of 6 dBm in the surface acoustic wave resonator 6 so as to be input to the amplifier 2 for oscillation. This leads the amplifier 2 for oscillation to operate in the saturated region so as to maintain the oscillation at the desired high frequency.

Adjusting the control voltage Vc of the phase shifter 7 in this condition varies the phase shift amount $\theta\beta$ shown in the above-described equation (1) such that the oscillation frequency of the oscillation circuit 1 changes so as to output the oscillation output of the desired frequency from the output terminal 4.

In the second embodiment, the surface acoustic wave resonator 6 is connected to the input side of the amplifier 2 for oscillation, and the power divider 5 is connected to the output side of the amplifier 2 for oscillation. This can suppress the input power of the surface acoustic wave resonator 6 in the same manner as the above-mentioned first embodiment. Accordingly, this also can minimize the power applied to the fine inter digital element having a size on the sub-micron order in the surface acoustic wave resonator 6 so as to prevent the electrode from deterioration, thereby maintaining a stable characteristic of the resonator for a long time. Consequently, an oscillation characteristic having low frequency aging and high reliability can be achieved even if it is assembled to the oscillation circuit.

In addition, using the minus 3 dB 90 degree hybrid coupler and the variable reactance circuit accompanied with it for the phase shifter 7 can achieve a large phase change with a low insertion loss and a low return loss. As a result, this makes it possible to take a wide frequency variable range of the voltage controlled oscillation circuit to enable a favorable frequency variable characteristic with respect to the control voltage Vc, thereby being able to be used as a standard oscillation circuit for a communication network system where a transmitting speed exceeds several gigabits per second.

In addition, the low insertion loss and the low return loss can minimize a circuit loss to achieve an efficient voltage controlled oscillation circuit having few output fluctuations.

While keeping the voltage controlled oscillation circuit having the configuration of the above-mentioned second embodiment in a continuous oscillation condition, a relationship between an elapsed time in continuous oscillation and a frequency deviation $\Delta f$ ($1 \times 10^{-6}$) has been measured. As shown by the solid line in FIG. 5, the frequency deviation $\Delta f$ can be kept at approximately $8 \times 10^{-6}$ even after 1000 hours have passed. This has proved sufficiently sustainable for continuous oscillation for a long time.

Figure 6:
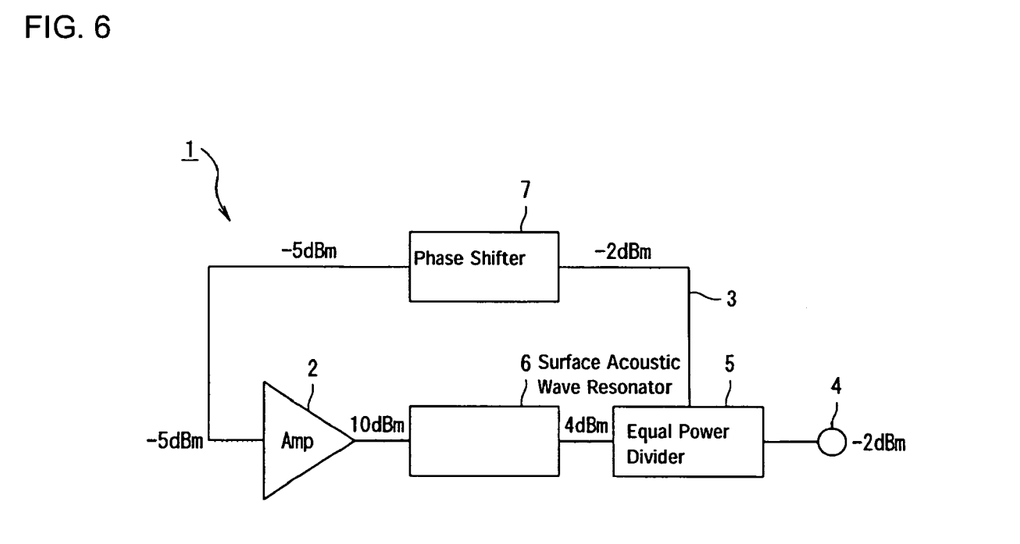
FIG. 6 is a block diagram illustrating the case where the surface acoustic wave resonator is connected to an output side of an amplifier.

In contrast, if the surface acoustic wave resonator 6 is provided to the output side of the amplifier 2 for oscillation as shown in FIG. 2, the output power of the amplifier 2 for an oscillation of 10 dBm is input to the surface acoustic wave resonator 6. The output power of the surface acoustic wave resonator 6 becomes 4 dBm. This is equally allocated such that the output power in and outside of the oscillating loop becomes minus 2 dBm respectively. Inputting the output power in the oscillation loop to the phase shifter 7 results in the output power of the phase shifter 7 being minus 5 dBm. This is fed back to the amplifier 2 for oscillation to generate the oscillation.

However, in the configuration of FIG. 6, the input power of the surface acoustic wave resonator 6 is 10 dBm. This is significantly high as compared with that of 4 and 3 dBm of the first and second embodiment respectively. The frequency deviation $\Delta f$ of the voltage controlled oscillation circuit having this configuration has been measured under continuous oscillation. As shown by the broken line in FIG. 5, the frequency deviation $\Delta f$ began to change after 100 hours have passed. When 1000 hours have passed, it exceeded minus $30 \times 10^{-6}$. That showed insufficient sustainability for continuous oscillation for a long time.

In addition, in the configuration of FIG. 6, the output power from the output terminal 4 is minus 2 dBm. This is significantly small as compared with the output power of 4 dBm of the first and second embodiment. This causes a power shortage and a requirement to employ a buffer amplifier or the like at the succeeding stage in order to amplify the power.

In the above-mentioned second embodiment, while the case where the minus 3 dB 90 degree hybrid coupler 8a was configured by a distributed constant type was described, the embodiment is not limited to this. A concentration constant type distribution may be employed.

Also, in the above-mentioned second embodiment, while the case where the output of the phase shifter 7 was directly input to the surface acoustic wave resonator 6 was described, the embodiment is not limited to this. The output may be supplied via a frequency adjustment circuit having a filter configuration. This makes it possible to compact the configuration of the voltage controlled oscillation circuit and to ease frequency adjustment.

Next, a third embodiment of the invention will be described with reference to FIG. 7.

In the third embodiment, the oscillation circuit 1 having the multiplying function of the invention is applied to a radio LAN device in the form of a portable radio communication device.

Figure 7:
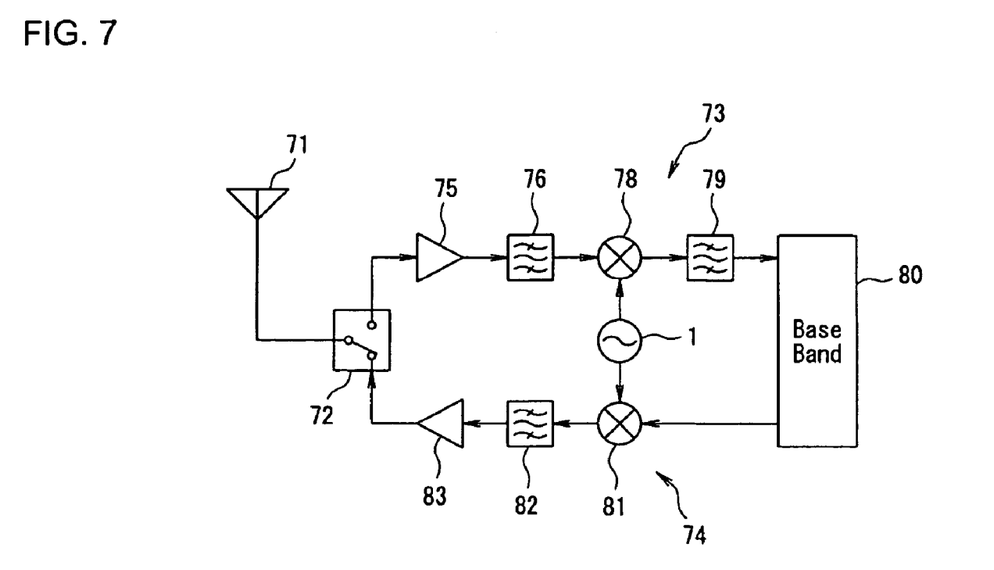
FIG. 7 is a block diagram illustrating a third embodiment of the invention.

In other words, in the third embodiment, as shown in FIG. 7, a transmitting and receiving antenna 71 connects a transmitting and receiving changeover circuit 72. A receiving side output terminal of the transmitting and receiving changeover circuit 72 connects to a receiving circuit 73. A transmitting side input terminal of the transmitting and receiving changeover circuit 72 connects to a transmitting circuit 74.

The receiving circuit 73 comprises a low noise amplifier (LNA) 75, a band-pass filter 76, a mixer 78 and a band-pass filter 79. The band-pass filter 76 inputs a receiving signal output from the transmitting and receiving changeover circuit 72. The mixer 78 inputs an amplified output signal of the low noise amplifier 75. The mixer 78 inputs a filtered output of the band-pass filter 76 and a local oscillating signal of several GHz output from the oscillation circuit of the above-mentioned first and second embodiment, and converts the filtered output down to be an intermediate frequency signal IF. The band-pass filter 79 inputs the intermediate frequency signal IF output from the mixer 78. A filtered output of the band-pass filter 79 is input to a base band signal processing circuit 80 as receiving data.

Further, the transmitting circuit 74 comprises a mixer 81, a band-pass filter 82 and a power amplifier 83. The mixer 81 inputs a transmitting signal from the base band signal processing circuit 80 and the local oscillating signal output from the above-mentioned oscillation circuit 1 having the multiplying function, and converts the transmitting signal up to be an output signal. The band-pass filter 82 inputs the transmitting signal output from the mixer 81. The power amplifier 83 amplifies a filtered output of the band-pass filter 82 and outputs the amplified signal to the transmitting and receiving changeover circuit 72.

In the third embodiment, when the receiving signal does not exist in the base band signal processing circuit 80, the receiving data is processed as follows. First, the transmitting and receiving changeover circuit 72 is changed over to the receiving circuit 73 side to be in a receiving state. The transmitting signal transmitted from another access point or the like and received by the transmitting and receiving antenna 71 is supplied to the low noise amplifier 75 via the transmitting and receiving changeover circuit 72. Then, the signal amplified by the low noise amplifier 75, is converted down to the intermediate frequency signal by the mixer 78. Finally, the receiving data filtered by the band-pass filter 79 are input to the base band signal processing circuit 80.

If the transmitting signal for another access point or the like exists in the base band signal processing circuit 80, the transmitting and receiving changeover circuit 72 is changed over to the transmitting circuit 74 side so as to output the transmitting data to the mixer 81. Subsequently, the transmitting signal is up converted in the mixer 81 to be filtered through the band-pass filter 82. Finally, it is amplified by the power amplifier 83 so as to be supplied to the transmitting and receiving antenna 71 for transmitting to another access point or the like via the transmitting and receiving changeover circuit 72.

For the radio LAN device, using the oscillation circuit 1 of the first and second embodiment for the local oscillator enables the local oscillator to be smaller and have a longer life, which leads to the radio LAN device to be configured compactly and to have a longer life.

In the third embodiment, while the case where the frequency was converted by one step was described, the embodiment is not limited to this. The case where the frequency is converted in multiple steps can be applicable for this invention.

Also, in the third embodiment, while the case where this invention was applied to the radio LAN was described, the embodiment is not limited to this. A short-range wireless communication device carrying out radio communication by a frequency hopping method using an ISM (Industrial, Scientific and Medical) band in a 2.4 GHz range, a mobile radio communication device such as a cellular phone or the like, a satellite broadcasting receiver, and other arbitrary communication devices can be applicable.

INDUSTRIAL APPLICABILITY

A surface acoustic wave resonator is provided in the feedback path of an amplifier and is connected to the input side of the amplifier so as to supply input power to saturate the amplifier. This can minimize the power applied to the surface acoustic wave resonator, keep continuous oscillation for a long time, and is applicable for a radio communication device used for a long time.

What is claimed is:

1. An oscillation circuit comprising:
an amplifier;
a surface acoustic wave resonator provided to a feedback path of the amplifier; and
a power divider outputting an oscillation signal in the feedback path to a location outside of the circuit;
wherein each of the amplifier, the surface acoustic wave resonator, and the power divider are connected to have a matched constant characteristic impedance, the surface acoustic wave resonator is coupled to an input side of the amplifier to continuously supply an input power to saturate the amplifier and there are no elements connected between the surface acoustic wave resonator and the amplifier; and
the power divider is coupled to an output side of the amplifier.

2. An oscillation circuit comprising:
an amplifier;
a surface acoustic wave resonator provided to a feedback path of the amplifier;
a phase shifter changing a phase in the feedback path by inputting a control voltage from outside of the circuit; and
a power divider outputting an oscillation signal in the feedback path to a location outside of the circuit;
wherein each of the amplifier, the surface acoustic wave resonator, and the power divider are connected to have a matched constant characteristic impedance, the surface acoustic wave resonator is coupled to an input side of the amplifier to continuously supply an input power to saturate the amplifier and there are no elements connected between the surface acoustic wave resonator and the amplifier; and
the power divider is coupled to an output side of the amplifier.

3. The oscillation circuit according to claim 1, wherein the surface acoustic wave resonator includes an inter digital transducer formed on a diamond substrate.

4. A radio communication device including the oscillation circuit according to claim 1.

5. The oscillation circuit according to claim 2, wherein the surface acoustic wave resonator includes an inter digital transducer formed on a diamond substrate.

6. A radio communication device including the oscillation circuit according to claim 2.

* * * * *